(12) United States Patent
Huang (10) Patent No.: US 7,212,006 B2
(45) Date of Patent: May 1, 2007

(54) METHOD AND APPARATUS FOR MONITORING THE CONDITION OF A BATTERY BY MEASURING ITS INTERNAL RESISTANCE

(75) Inventor: Yung-Sheng Huang, Toronto (CA)

(73) Assignee: BPPower, Inc., Taipei (TW)

( * ) Notice: Subject to any disclaimer, the term of this patent is extended or adjusted under 35 U.S.C. 154(b) by 299 days.

(21) Appl. No.: 10/882,196

(22) Filed: Jul. 2, 2004

(65) Prior Publication Data
US 2006/0001429 A1 Jan. 5, 2006

(51) Int. Cl.
*H01M 10/46* (2006.01)
(52) U.S. Cl. .................................................. 324/430
(58) Field of Classification Search ................ 320/132, 320/149; 324/426, 430, 433
See application file for complete search history.

(56) References Cited

U.S. PATENT DOCUMENTS

| | | |
|---|---|---|
| 3,781,658 A | 12/1973 | Godshalk |
| 3,852,732 A | 12/1974 | Yorksie et al. |
| 3,873,911 A | 3/1975 | Champlin |
| 3,876,931 A | 4/1975 | Godshalk |
| 3,909,708 A | 9/1975 | Champlin |
| 3,984,762 A | 10/1976 | Dowgiallo, Jr. |
| 4,025,916 A | 5/1977 | Arnold et al. |
| 4,052,717 A | 10/1977 | Arnold et al. |
| 4,193,025 A | 3/1980 | Frailing et al. |
| 4,193,026 A | 3/1980 | Finger et al. |
| 4,231,027 A | 10/1980 | Mann |
| 4,290,021 A | 9/1981 | Theron et al. |
| 4,333,149 A | 6/1982 | Taylor et al. |
| 4,361,809 A | 11/1982 | Bil et al. |
| 4,423,378 A | 12/1983 | Marino et al. |
| 4,423,379 A | 12/1983 | Jacobs et al. |
| 4,678,998 A | 7/1987 | Muramatsu |
| 4,697,134 A | 9/1987 | Burkum et al. |
| 4,719,428 A | 1/1988 | Liebermann |
| 4,743,855 A | 5/1988 | Randin et al. |
| 4,816,768 A | 3/1989 | Champlin |
| 4,825,170 A | 4/1989 | Champlin |
| 4,888,716 A | 12/1989 | Ueno |
| 4,912,416 A | 3/1990 | Champlin |
| 4,937,528 A | 6/1990 | Palanisamy |
| 4,952,862 A | 8/1990 | Biagetti et al. |
| 5,027,294 A | 6/1991 | Fakruddin et al. |
| 5,047,722 A | 9/1991 | Wurst et al. |
| 5,047,961 A | 9/1991 | Simonsen |
| 5,049,803 A | 9/1991 | Palanisamy |
| 5,061,898 A | 10/1991 | Oram et al. |
| 5,124,627 A | 6/1992 | Okada |
| 5,130,699 A | 7/1992 | Reher et al. |
| 5,137,020 A | 8/1992 | Wayne et al. |
| 5,159,272 A | 10/1992 | Rao et al. |
| 5,193,067 A | 3/1993 | Sato et al. |
| 5,195,813 A | 3/1993 | Brown |
| 5,206,097 A | 4/1993 | Burns et al. |
| 5,281,919 A | 1/1994 | Palanisamy |
| 5,298,346 A | 3/1994 | Gyenes |
| 5,315,228 A | 5/1994 | Hess et al. |
| 5,321,627 A | 6/1994 | Reher |
| 5,349,282 A | 9/1994 | McClure |
| 5,349,535 A | 9/1994 | Gupta |
| 5,357,203 A | 10/1994 | Landau et al. |
| 5,381,096 A | 1/1995 | Hirzel |
| 5,459,671 A | 10/1995 | Duley |
| 5,469,042 A | 11/1995 | Ruhling |
| 5,488,282 A | 1/1996 | Hayden et al. |
| 5,496,658 A | 3/1996 | Hein et al. |
| 5,519,304 A | 5/1996 | Andrieu et al. |
| 5,521,443 A | 5/1996 | Imura et al. |
| 5,555,498 A | 9/1996 | Berra |
| 5,572,136 A | 11/1996 | Champlin |
| 5,578,915 A | 11/1996 | Crouch, Jr. et al. |
| 5,578,927 A | 11/1996 | Perelle |
| 5,585,728 A | 12/1996 | Champlin |
| 5,596,567 A | 1/1997 | de Muro |
| 5,600,230 A | 2/1997 | Dunstan |
| 5,606,242 A | 2/1997 | Hull et al. |
| 5,621,298 A | 4/1997 | Harvey |
| 5,633,573 A | 5/1997 | van Phuoc et al. |
| 5,703,464 A | 12/1997 | Karunasiri |
| 5,705,929 A | 1/1998 | Caravello et al. |

(Continued)

FOREIGN PATENT DOCUMENTS

| | | |
|---|---|---|
| JP | 9061505 | 3/1997 |

(Continued)

OTHER PUBLICATIONS

Feder et al, Field and Laboratory Studies to Assess the State of Health of Valve-Regulated Lead Acid Batteries, IEEE (1992).

(Continued)

*Primary Examiner*—Edward H. Tso
(74) *Attorney, Agent, or Firm*—Michael de Angeli (57) ABSTRACT

The method comprises coupling an external load having a predetermined resistance directly in series with the battery, conducting a power transistor to supply a transient large current to the battery for sampling voltage of the battery in a set very short period of time, and determining the internal resistance of the battery. The internal resistance of the battery can then be compared with a predetermined warning value of internal resistance of the battery so as to determine whether the former is equal to or larger than the warning value, and displaying a warning on a display if the determination is affirmative. The invention enables a driver to correctly know the condition of the battery in substantially real time while consuming a minimum amount of current.

27 Claims, 6 Drawing Sheets

U.S. PATENT DOCUMENTS

| | | |
|---|---|---|
| 5,721,688 A | 2/1998 | Bramwell |
| 5,751,217 A | 5/1998 | Kchao et al. |
| 5,764,469 A | 6/1998 | Slepian et al. |
| 5,821,756 A | 10/1998 | McShane et al. |
| 5,828,218 A | 10/1998 | Yokoo |
| 5,831,435 A | 11/1998 | Troy |
| 5,895,440 A | 4/1999 | Proctor et al. |
| 5,900,734 A | 5/1999 | Munson |
| 5,963,012 A | 10/1999 | Garcia |
| 6,020,717 A | 2/2000 | Kadouchi |
| 6,064,180 A | 5/2000 | Sullivan |
| 6,072,300 A | 6/2000 | Tsuji |
| 6,081,098 A | 6/2000 | Bertness et al. |
| 6,097,193 A | 8/2000 | Bramwell |
| 6,133,709 A | 10/2000 | Puchianu |
| 6,184,656 B1 | 2/2001 | Karunasiri |
| 6,201,373 B1 | 3/2001 | Arai et al. |
| 6,249,106 B1 | 6/2001 | Turner et al. |
| 6,263,268 B1 | 7/2001 | Nathanson |
| 6,313,608 B1 | 11/2001 | Varghese et al. |
| 6,331,762 B1 | 12/2001 | Bertness |
| 6,411,912 B1 | 6/2002 | Sack |
| 6,424,157 B1 | 7/2002 | Gollomp |
| 6,469,511 B1 | 10/2002 | Vonderhaar et al. |
| 6,469,512 B2 | 10/2002 | Singh et al. |
| 6,531,875 B2 | 3/2003 | Satake |
| 6,586,941 B2 | 7/2003 | Bertness et al. |
| 6,611,774 B1 | 8/2003 | Zaccaria |
| 6,633,165 B2 | 10/2003 | Bertness |
| 6,677,759 B2 | 1/2004 | Friel |
| 6,704,629 B2 | 3/2004 | Huang |
| 6,791,464 B2 | 9/2004 | Huang |
| 6,850,037 B2 | 2/2005 | Bertness |
| 6,871,151 B2 | 3/2005 | Bertness |
| 7,003,411 B2 | 2/2006 | Bertness |
| 7,058,525 B2 | 6/2006 | Bertness et al. |
| 2003/0067221 A1 | 4/2003 | Disser et al. |

FOREIGN PATENT DOCUMENTS

| | | |
|---|---|---|
| JP | 10056744 | 2/1998 |

OTHER PUBLICATIONS

Berndt et al, "Monitoring of Stationary Valve-Regulated Lead Acid Batteries" (IEEE, 1991).

METHOD AND APPARATUS FOR MONITORING THE CONDITION OF A BATTERY BY MEASURING ITS INTERNAL RESISTANCE

BACKGROUND OF THE INVENTION

1. Field of the Invention

The present invention relates to monitoring apparatuses and more particularly to a method of monitoring the electric power, that is, the condition of a battery by measuring the internal resistance of the battery by means of an external load and comparing the internal resistance of the battery with a predetermined warning value thereof so as to display a warning if the power is lower than a predetermined level.

2. Description of Related Art

It is known that a driver has to start the engine of a motor vehicle prior to driving it. Also, for successfully starting the engine, there must be sufficient electric power in the battery. Typically, a battery has an approximate lifetime. However, factors such as ambient temperature, charging conditions and time, and load discharge all can adversely affect the lifetime of the battery. Thus, there is a difference between the practical lifetime and the design lifetime of any particular battery and the difference is sometimes very large. Hence, in practice, there is no way for a driver (even an experienced one) to know the electric power level of the battery prior to starting the engine. Typically, only a motor vehicle repair shop can know the electric power level by means of a measuring device. The measuring device is bulky, thus prohibiting it from being carried by the motor vehicle. It is common that a driver finds the battery to be low only when it fails to start the engine. Alternatively, the battery may be already damaged but the driver is not aware before a next start even it is successful in a particular start. This is not desirable and may even be dangerous since the driver may park his/her car in a remote area, mountain, or desert.

Advantageously, a battery power measuring device would be installed in a car as a requisite equipment. But power measurement of the battery may also consume the electric power of the battery. Hence, a frequent power measurement is not desirable. Thus, it is desirable to accurately measure the electric power of battery in a relatively short period of time by consuming a minimum electric power thereof. The present application is relevant to commonly assigned U.S. Pat. Nos. 6,704,629 and 6,791,464, both entitled "Device for Monitoring Motor Vehicle's Electric Power and Method Thereof", both incorporated by reference herein.

SUMMARY OF THE INVENTION

It is an object of the present invention to provide a method of monitoring electric power, i.e., the condition, of a battery by coupling an external load having a predetermined resistance in series with the battery, controlling a power transistor to conduct so as to draw a transient large current from the battery for a very short period of time while sampling the voltage across the battery, determining the internal resistance of the battery, comparing the internal resistance of the battery with a predetermined value of internal resistance of the battery so as to determine whether the former is equal to or larger than the predetermined value or not, and displaying a warning on a display if the determination is affirmative. By utilizing this method, it is possible to enable a driver to know the electric power of the battery, that is, its condition, in substantially real time.

It is another object of the present invention to provide a method of monitoring electric power of battery by coupling an external load having a very small resistance in series with the battery, and operating a power transistor to draw a transient large current from the battery for sampling voltage of the battery for N times so as to enable a driver to correctly know the electric power of the battery in an energy saving manner.

It is yet another object of the present invention to provide a method of monitoring electric power of a battery by selecting a warning value of internal resistance of the battery from a plurality of values, sampling voltage of the battery in a set sampling time, calculating an internal resistance of the battery by means of a coupled external load, comparing the internal resistance of the battery with one of the predetermined warning values of internal resistance of the battery so as to determine whether the former is equal to or larger than the predetermined warning value or not, and displaying a warning in multiple stage manner on a display if the determination is affirmative.

In one aspect of the present invention, there is provided an apparatus for monitoring electric power of a battery, comprising a microprocessor control unit (MCU) responsible for controlling the apparatus so as to sample a voltage of the battery in predetermined periods of time, calculate an internal resistance of the battery, and compare the internal resistance of the battery with a predetermined value of the internal resistance of the battery; a voltage-stabilizing circuit being optionally used for providing a stable voltage to the apparatus during operating periods; an external load having a predetermined resistance directly coupled in series with the battery so as to calculate the internal resistance of the battery; a voltage-sampling circuit responsible for sampling voltage of two terminals of the battery with a transient large current; a transient current control circuit including a power transistor in parallel to the battery and controlled by the MCU for controlling the magnitude of the transient current through the external load and sampling the voltage of the battery; and a display responsible for displaying a warning if the comparison done by the MCU shows the internal resistance of the battery is equal to or larger than the predetermined value of the internal resistance of the battery.

In another aspect of the present invention, there is provided a method of monitoring electric power of a battery, comprising the steps of (i) selecting an external load the resistance of which is based on the battery type, especially the internal resistance of the battery; (ii) selecting a predetermined value to which the internal resistance of the battery will be compared; (iii) sampling voltage at two terminals of the battery while a transient large current is drawn by the external load by operating a power transistor intermittently N times so as to obtain a voltage curve by connecting the N sampled voltages together; (iv) dividing the sampled voltage by the resistance of the external load to obtain the current of the battery, and obtaining the internal resistance of the battery by calculation; (v) comparing the obtained internal resistance of the battery with the predetermined warning value of internal resistance of the battery so as to determine whether the former is equal to or larger than the predetermined warning value; and (vi) displaying a warning on a display if the determination in step (v) is affirmative.

In a further aspect of the present invention, there is provided a method of monitoring electric power of a battery, comprising the steps of (1) selecting a resistance of an external load; (2) selecting a predetermined value for comparison to the internal resistance of the battery to be measured; (3) transiently sampling the no load voltage Vo1 between two terminals of the battery to be measured K1 times, where K1≧1, and sampling the no load voltage Vo2 between two terminals of the external load L1 times, where L1≧1, and calculating and storing the average of the voltages Vo1 and Vo2; (4) adding the external load and operating the power transistor to conduct so as to provide a transient large current; (5) transiently sampling the load voltage Vi1 between two terminals of the battery K2 times, where K2≧1, sampling the load voltage Vi2 between two terminals of the external load L2 times, where L1≧1, and calculating and storing an average of voltages Vi1 and Vi2; (6) calculating the internal resistance of the battery by dividing an average of the sampled voltages by the transient large current; (7) comparing the internal resistance of the battery with the predetermined value of the internal resistance of the battery so as to determine whether the former is equal to or larger than the predetermined value and (8) displaying a warning on a display if the determination in step (7) is affirmative.

The above and other objects, features and advantages of the present invention will become apparent from the following detailed description taken with the accompanying drawings.

DETAILED DESCRIPTION OF THE PREFERRED EMBODIMENTS

Figure 1:
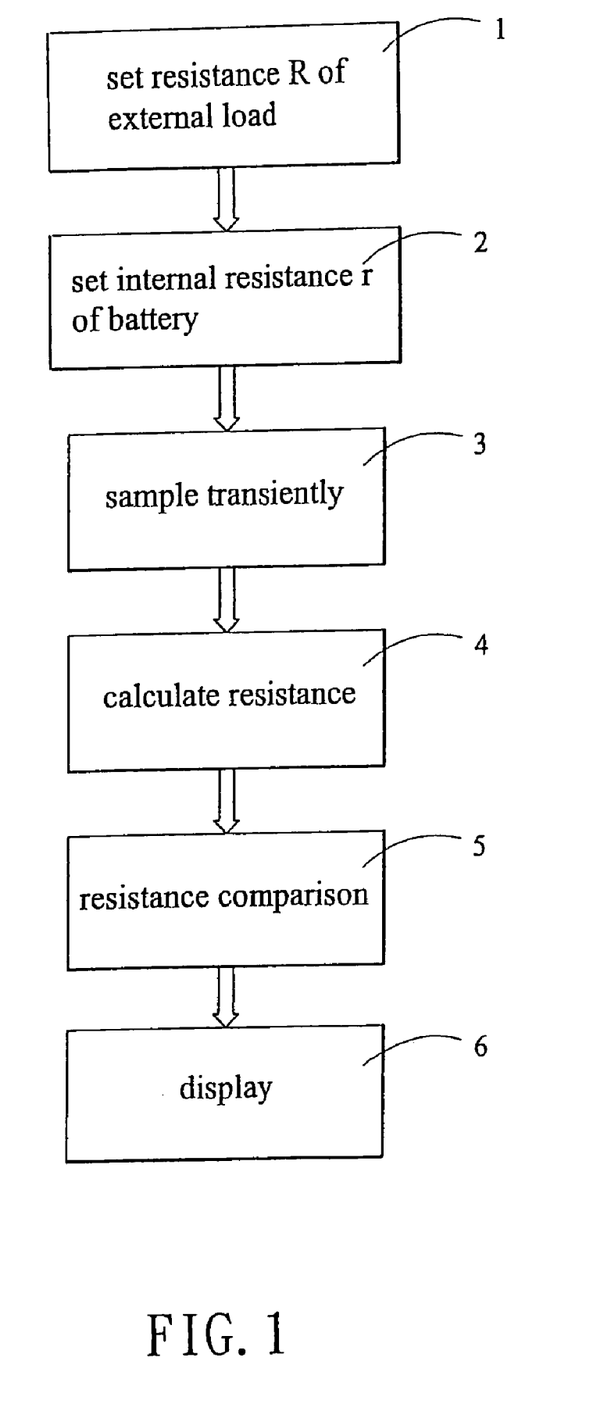
FIG. 1 is a flow chart illustrating a process of monitoring the electric power , i.e., the condition, of a battery according to the invention.
Figure 8:
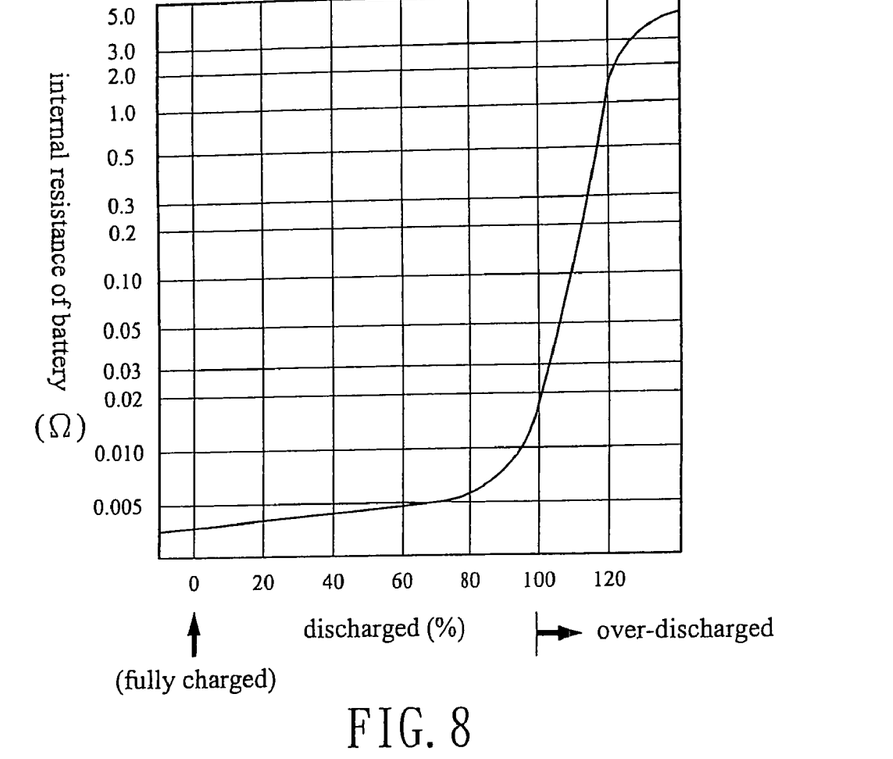
FIG. 8 plots internal resistance of the battery versus discharge percentage for a discharge curve according to the invention.

Referring to FIGS. 1 and 8, a process of monitoring the electric power of a battery according to the invention is illustrated.

In step 1, the resistance R of an external load is set, that is, selected, from values between 25 uΩ to 1000 mΩ optionally using an amplifier, based on battery type and the internal resistance of the battery to be measured.

In step 2, the predetermined value to which the internal resistance r of the battery will be compared is selected from the range of 0.001Ω to 1.5Ω based on the battery type. An appropriate setting depends on applications so as to provide a predetermined value, a warning range, or one of a plurality of predeterminated warning values for multiple stages of warning before the end of discharging (see FIG. 8).

In step 3, the voltage at two terminals of the battery is sampled while a transient large current is drawn by the external load by controlling a power transistor to conduct transiently, that is, intermittently, so as to obtain a plurality of sampled voltages. A voltage curve is formed by connecting a plurality of sampled voltages together.

In step 4, the sampled voltage is divided by the resistance of the external load (R) to obtain a current of the battery. And in turn, an internal resistance (r) of the battery to be measured is obtained by dividing the sampled voltage (V) by the current (I) of the battery.

In step 5, the obtained internal resistance of the battery is compared with the predetermined value of internal resistance (r) of the battery so as to determine whether the former is in a predetermined warning range or not.

In step 6, a warning is displayed on a display if the comparison result in step 5 is affirmative.

Figure 2:
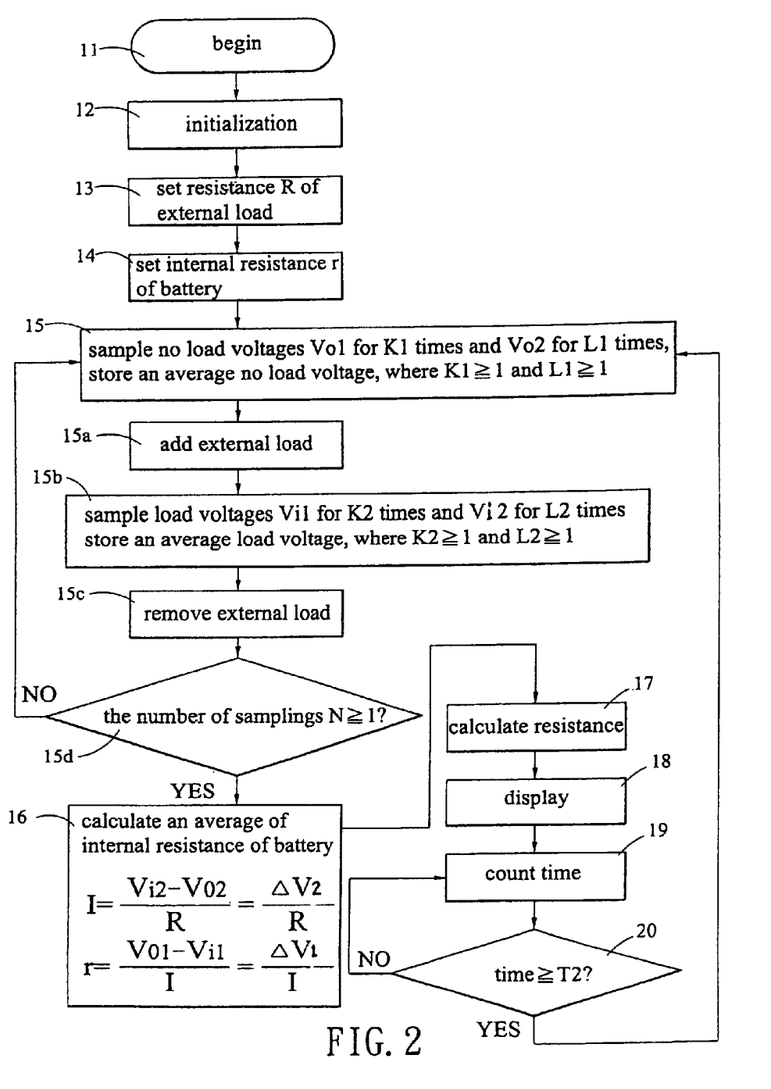
FIG. 2 is a detailed flow chart illustrating the FIG. 1 process.
Figure 7:
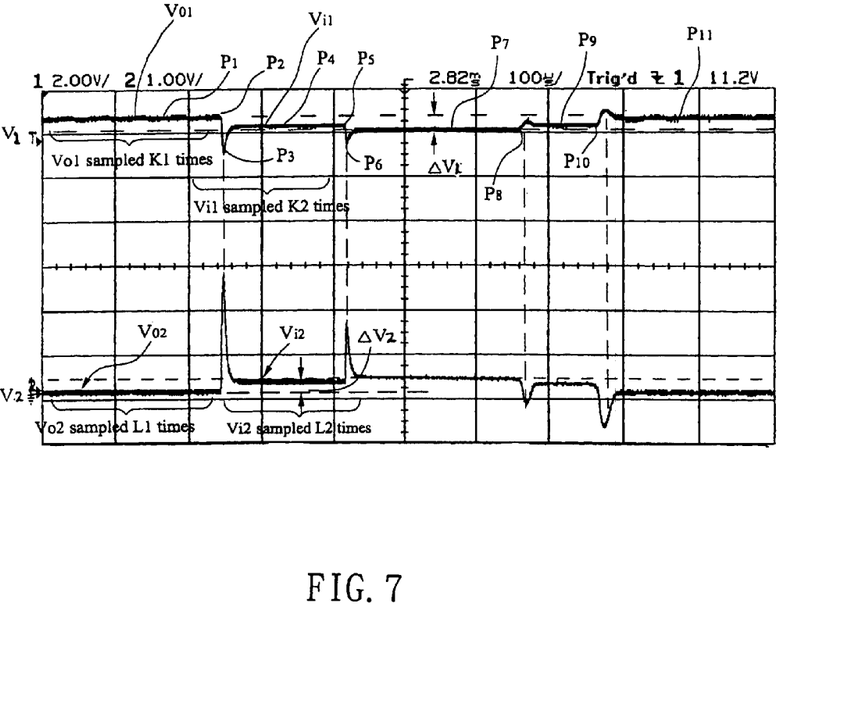
FIG. 7 plots sampled voltage versus sampling time for voltage curves according to the invention.

Referring to FIGS. 2, 7 and 8, detailed method steps of the above process are illustrated.

In step 11, the process begins by setting an interrupt vector address as an initial address of a program.

In step 12, a register and I/O pins are initialized for setting an initial value of the register, the interrupt vector and timer are activated, and state and initial value of each I/O pin is defined.

In step 13, the resistance (R) of the external load is set as 25 uΩ to 1000 mΩ based on requirement of battery type and an internal resistance of the battery to be measured. The resistance R of the external load can be amplified.

In step 14, the predetermined value to which the internal resistance r of the battery will be compared is set as 0.001Ω to 1.5Ω based on the battery type. An appropriate setting value depends on applications so as to provide a predetermined warning value before the end of discharging (see FIG. 8).

In step 15, the no load voltage is sampled a plurality of times. As shown in FIG. 7, prior to providing a transient large current by the power transistor, the no load voltage Vo1 between two terminals of the battery to be measured is sampled for K1 times, where K1≧1, the no load voltage Vo2 between two terminals of the load is sampled for L1 times, where L1≧1, and average values of voltages Vo1 and Vo2 are calculated and stored.

In step 15a, the external load having resistance R is added and the power transistor is operated so as to conduct, so that a large amount of current is drawn.

In step 15b, the load voltages Vi1 and Vi2 are sampled in a transient sampling time (see FIG. 7). The transient sampling time is within 0.01 second and is set as voltage sampling time. After providing a transient large current by the power transistor, load voltage Vi1 between two terminals of the battery to be measured is sampled for K2 times, where K2≧1, load voltage Vi2 between two terminals of the load is sampled for L2 times, where L1≧1, and average values of voltages Vo1 and Vi2 is are calculated and stored. The transient large current is preferably in the range of 1 A to 500 A.

More specifically, "large current" as used herein is typically a current equal to between 1 C and 5 C, where C, as is usual in the industry, is the number of ampere-hours (a-h) that can be provided by a given battery in 20 hours. For example, a battery rated at 34 a-h can deliver 34 a-h if discharged over a period of 20 hours, so 1 C for this battery is 34 amperes.

In step 15c, the external load having resistance (R) is removed. The power transistor is cut off with no transient large current output.

In step 15d, it is determined whether the number of samples is equal to N, where N≧1. If yes, the process goes to step 16. Otherwise, the process loops back to step 15.

Figure 9:
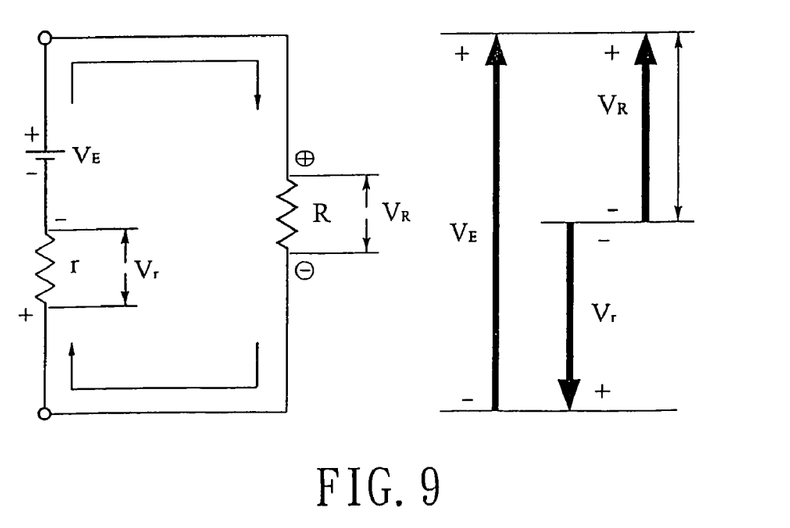
FIG. 9 is an equivalent circuit of the battery and a series external load according to the invention.

In step 16, the average of the internal resistance (r) of the battery to be measured is calculated by referring to FIG. 9 as below. Current I of the battery to be measured is obtained by the following equation.

$$I = \frac{Vi2 - Vo2}{R} = \frac{\Delta Vi2}{R}$$

Further, the internal resistance (r) of the battery to be measured is calculated by the following equation.

$$r = \frac{Vo1 - Vi1}{I} = \frac{\Delta Vo1}{I}$$

In step 17, the internal resistance (r) of the battery obtained in step 16 is compared with the predetermined value of internal resistance of the battery selected in step 14 so as to determine whether the former is in a warning range or not.

In step 18, an alarm is displayed on a display in response to reaching the value in step 17.

In step 19, timer begins to count time.

In step 20, it is determined whether time is equal to time T2 of a next sampling. If yes, the process loops back to step 15 for a next sampling. Otherwise, the process loops back to step 19. That is, the condition of the battery is evaluated from time to time, so as to reduce the total current drawn.

The voltage sampling process from step 15 to step 15d takes one period of time. This is depicted in the graph of FIG. 7 of sampled voltage versus sampling time for voltage curves according to the invention. Variation in the voltage across the battery is shown in the upper trace $V_1$, while the corresponding voltage across the known load of resistance R is shown by the lower trace $V_2$. In the graph of FIG. 7, voltages Vo1 and Vo2 are obtained in step 15 and voltages Vi1 and Vi2 are obtained in step 15b.

Referring to the voltage curves in FIG. 7 again, the sampling with respect to respective voltage curves can be best understood. Curve P1, as a section of the battery voltage curve $V_1$, is the no load voltage curve Vo1 of the battery voltage, that is, is not conducting. That is, curve P1 is the voltage curve Vo1 which has been sampled for K1 times. Likewise, no load voltage curve Vo2 (on the lower trace $V_2$) is the no-load voltage measured at two terminals of the external load R at the same sampling time. That is, voltage curve Vo2 represents the no-load voltage across the load, having been sampled L1 times. A voltage Vo2 may be detected across the external load although a test current is not flowing therethrough from the battery responsive to other components in the system, e.g., other electrical components connected across the battery of an automobile.

Curve P2 represents the transient voltage when the power transistor Q1 is conducted. Curve P3 represents a transition from a lowest voltage of two terminals of the battery to a highest voltage of the same after the power transistor Q1 has begun conducting. Curve P4 represents a section when both the voltage of the battery and the voltage measured at two terminals of the load R become stable after the power transistor Q1 has begun conducting. Curve P5 represents the transient voltage when the power transistor Q2 is conducted again (see FIG. 4). Curve P6 represents a transition from a lowest voltage of two terminals of the battery to be measured to a highest voltage of the same after the power transistor Q2 has begun conducting. Curve P7 represents a section of stable voltage after both the power transistors Q1 and Q2 have begun conducting. Curve P8 represents the transient voltage when the power transistor Q2 is cut off. Curve P9 represents a section when both the voltage of the battery and the voltage measured at two terminals of the load R become stable after the power transistor Q2 has been cut off. Curve P10 represents the transient voltage when the power transistor Q1 is cut off. Curve P11 represents a section of stable voltage after both the power transistors Q1 and Q2 have been cut off. At this time, voltage represented by curve P11 is equal to that represented by curve P1.

Figure 3:
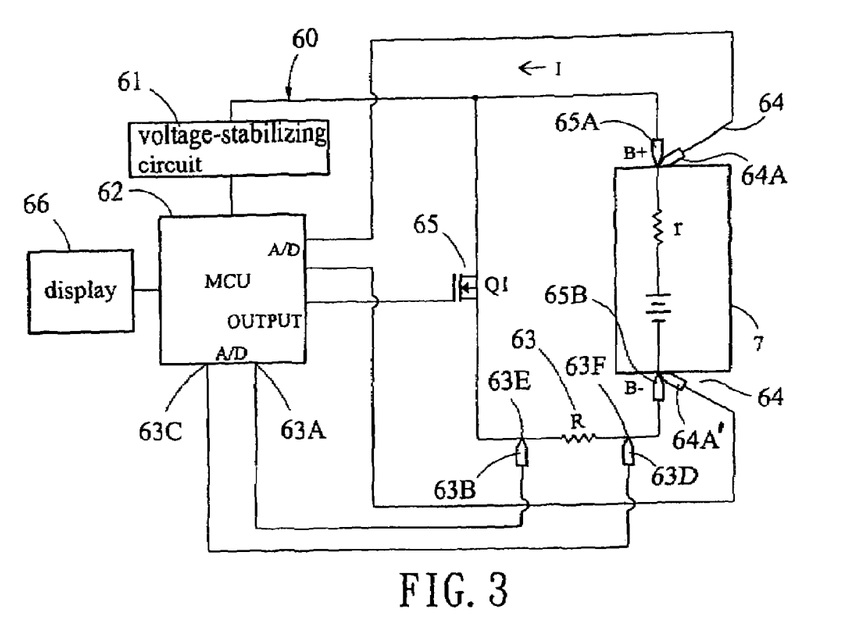
FIG. 3 is an electrical block diagram of a first preferred embodiment of apparatus for monitoring the battery's electric power according to the invention.

Referring to FIG. 3, there is shown an electrical block diagram of a first preferred embodiment of apparatus 60 for monitoring the battery's electric power according to the invention. The apparatus 60 comprises a MCU (microprocessor control unit) 62, a voltage-stabilizing circuit 61 (optionally provided depending on the actual application), an external load 63, a voltage-sampling circuit 64, a transient current control circuit 65, and a display 66. Each component will be described in detail below.

The MCU 62 is responsible for controlling the apparatus 60 so as to send signals to the battery 7 for sampling its voltage in predetermined periods of time, calculate the internal resistance r of the battery 7, and compare the warning value of internal resistance r with a predetermined value thereof for warning if necessary. The voltage-stabilizing circuit 61 is optionally used for providing a stable voltage to the apparatus 60 during operating periods, that is, if the apparatus 60 used a stable DC cell or battery, then, the voltage-stabilizing circuit 61 can be omitted accordingly. The external load 63 has a predetermined resistance. In a preferred embodiment of the invention, the external load 63 is a resistor. The resistance R of the external load is set as 25 uΩ to 1000 mΩ and is provided directly in series with the battery so as to calculate the internal resistance r of the battery. Note that the external load 63 has a substantially very low resistance so as to be able to sample the voltage of the battery 7 in a very short period of time. For example, sampling voltage by optionally applying a transient larger amount of current 1 A to 500 A is required (to sample voltage) within 0.01 second. Also note that the external load 63 is implemented as a resistor such as Manganin or formed of any of a number of other alloys known to the art. Alternatively, the external load 63 can be implemented as a switching element having a resistance; for example, the internal resistance of Power Transistor Q1 (and Q2, in the FIG. 4 embodiment) of the transient current control circuit 65 can be used as the external load 63, so that the external load (R) 63 in this embodiment can be omitted from the circuit 65A–65B of FIG. 3. Furthermore, the external load 63 can also be implemented by a portion of conductor extended between two terminals of the battery, such as a portion of conductor between two terminals 63E and 63F (without R) or the conductor between A/D i.e. terminals 63A–63B, 63C–63D. Note that in a preferred embodiment of the invention the voltage-sampling circuit 64 is responsible for sampling voltage across two terminals 64A, 64A'. As shown in FIG. 3, one terminal 64A is electrically interconnected a positive terminal of A/D pin of MCU 62 and a positive terminal of the battery 7 and the other terminal 64A' is electrically interconnected to a negative terminal of A/D pin of MCU 62 and a negative terminal of the battery 7. As an end, a correct voltage can be sampled. That is, signal conductors connected to terminals 64A, 64A' allow measurement of the voltage across the battery separately from the voltage across the load R. The transient current control circuit 65 is controlled by the MCU 62. In a preferred embodiment of the invention the transient current control circuit 65 is implemented as power transistor Q1 directly connected in parallel to the battery. The transient current control circuit 65 serves as a switch of the apparatus and is responsible for controlling the magnitude of transient current of the load. That is, a regulated transient current is drawn from the battery 7 for sampling voltage thereof during voltage sampling periods. The display 66 is responsible for displaying a warning if the comparison of the internal resistance of the battery with the set warning value of internal resistance of the battery by the MCU 62 show that a warning value has been reached.

In brief, after connecting the apparatus 60 for monitoring the battery's electric power according to the invention to the battery to be measured 7, optionally, the voltage-stabilizing circuit 61 provides required voltage to the apparatus including the MCU 61 during operating periods. The MCU 62 then performs above operations based on the method of monitoring electric power by comparing internal resistance of its battery with that of external load. First, the voltage-sampling circuit 64 samples voltage of the battery 7 when the external load 63 is temporarily removed. After adding the external load 63 to the apparatus, the power transistor Q1 of the transient current control circuit 65 conducts to provide a transient large amount of current. Next, the voltage-sampling circuit 64 samples voltage of the battery 7 when the external load 63 is added. After sampling voltage for N times in a predetermined period of time, the MCU 62 removes the load and calculates the internal resistance r of the battery 7 by making use of the sampled voltage and the equations above. Further, the obtained internal resistance r of the battery 7 is compared with the predetermined value of internal resistance of the battery. As an end, a warning is displayed on the display 66 if necessary.

Figure 4:
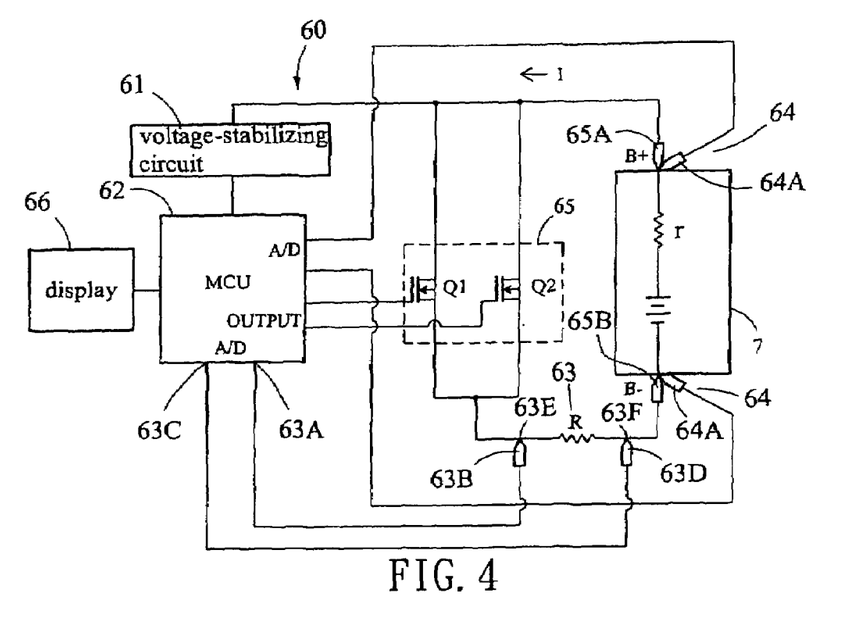
FIG. 4 is an electrical block diagram of a second preferred embodiment of apparatus for monitoring the battery's electric power according to the invention.

Referring to FIG. 4, there is shown an electrical block diagram of a second preferred embodiment of apparatus 60 of monitoring the battery's electric power according to the invention. The second preferred embodiment substantially has same structure as the first preferred embodiment. The characteristics of the second preferred embodiment are detailed below. The transient current control circuit 65 of the apparatus 60 is implemented as two parallel power transistors Q1 and Q2. The power transistors Q1 and Q2 are sequentially conducted so as to obtain a lowest voltage value of two terminals. This is shown in the curves P3 and P6 in FIG. 7.

Figure 5:
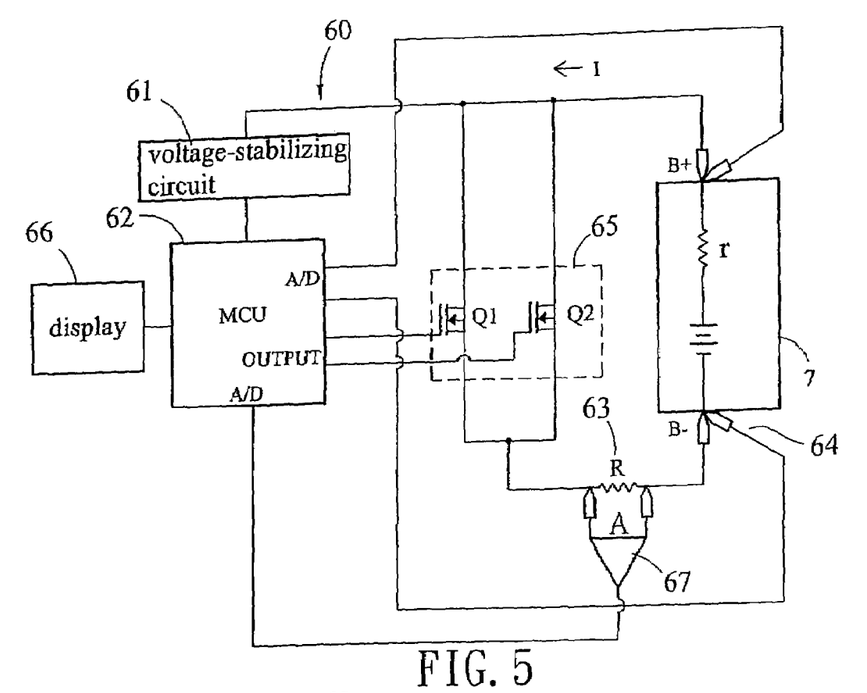
FIG. 5 is an electrical block diagram of a third preferred embodiment of apparatus for monitoring the battery's electric power according to the invention.

Referring to FIG. 5, there is shown an electrical block diagram of a third preferred embodiment of apparatus 60 of monitoring the battery's electric power according to the invention. The third preferred embodiment substantially has same structure as the second preferred embodiment. The characteristics of the third preferred embodiment are detailed below. The external load 63 has a very low resistance. An amplifier 67 is optionally interconnected to the external load 63 and the MCU 62. Preferably, the external load 63 has a resistance lower than 1000 uΩ.

Figure 6:
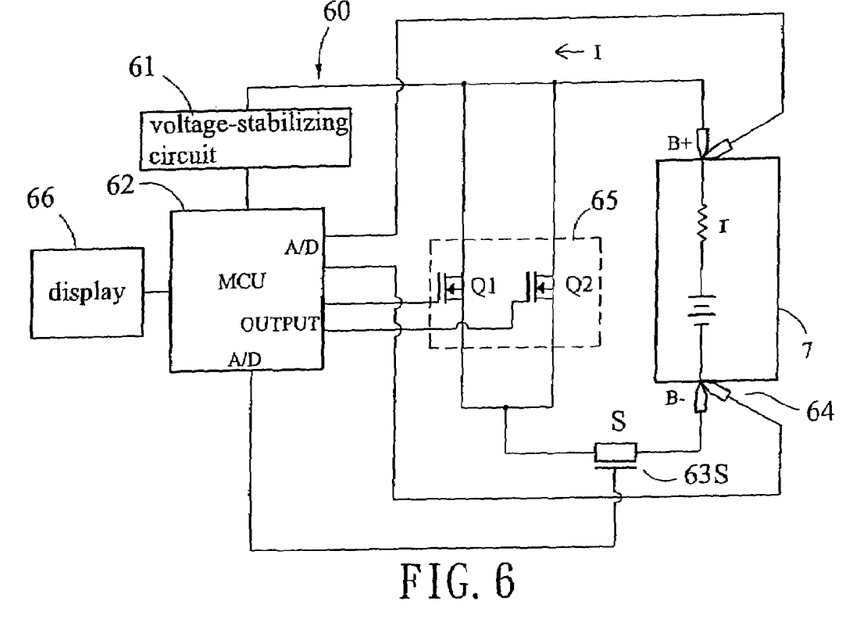
FIG. 6 is an electrical block diagram of a fourth preferred embodiment of apparatus for monitoring the battery's electric power according to the invention.

Referring to FIG. 6, there is shown an electrical block diagram of a fourth preferred embodiment of apparatus 60 of monitoring the battery's electric power according to the invention. The fourth preferred embodiment substantially has same structure as the second preferred embodiment. The characteristics of the fourth preferred embodiment are detailed below. The external load 63 is implemented as a shunt unit S labeled as 63S. In the preferred embodiment, a shunt load of the single battery to be measured is implemented as a shunt circuit for obtaining the same effect as any of the above embodiments.

While the invention herein disclosed has been described by means of specific embodiments, numerous modifications and variations could be made thereto by those skilled in the art without departing from the scope and spirit of the invention set forth in the claims.

What is claimed is:

1. A method of evaluating the condition of a battery, comprising the steps of:
   (i) selecting a known external load the resistance of which is based on the type of the battery, such that when the load is connected across the battery a large current is drawn;
   (ii) selecting a nominal value for the internal resistance of the battery based on its type;
   (iii) connecting the external load across the terminals of the battery for at least one short duration interval(s), measuring the voltages; across the battery and across the external load while current is conducted through the load, and, if more than one such measurement is made of each voltage, taking the average of the measured values of the voltages ;
   (iv) dividing the measured value of the voltage across the load, or, if more than one measurement is made, the average of the measured values of the voltage across the load by the resistance of the external load to determine the current drawn from the battery;
   (v) dividing the measured value of the voltage across the battery, or, if more than one measurement is made, the average of the measured values of the voltage across the battery by the determined value of the current in order to calculate the internal resistance of the battery;
   (vi) comparing the calculated internal resistance of the battery with the selected nominal value of the internal resistance of the battery so as to determine whether the calculated value is equal to or larger than the selected nominal value or not; and
   (vii) provide an output to a user responsive to the determination in step (vi).

2. The method of claim 1, wherein the selected nominal value of the internal resistance of the battery to which the calculated value thereof is compared is a predetermined warning value.

3. The method of claim 1, wherein the value of the internal resistance of the battery to be measured is 0.001Ω to 1.5Ω.

4. The method of claim 1, wherein the resistance of the external load is in a range from 25 uΩ to 1000 mΩ.

5. The method of claim 1, wherein the resistance of the external load is coupled to an amplifier.

6. The method of claim 1, wherein the external load is a conductor controllably connected between two terminals of the battery.

7. The method of claim 1, wherein the external load is provided as the internal resistance of a power transistor.

8. The method of claim 1, wherein the transient large current is in a range from 1 A to 500 A.

9. The method of claim 1, wherein the transient large current is in a range from 1 C to 5 C.

10. The method of claim 1, wherein the transient sampling time is less than 0.01 second.

11. A method of evaluating the condition of a battery, comprising the steps of:
  (1) choosing an external load, the resistance R of which is selected in accordance with the type of the battery to be evaluated;
  (2) selecting a value for the nominal internal resistance of the battery in accordance with its type;
  (3) sampling the no load voltage Vo1 between two terminals of the battery a plurality of times, and sampling the no load voltage Vo2 between two terminals of the external load a plurality of times, and calculating and storing average values of the voltages Vo1 and Vo2;
  (4) providing at least one power transistor controlled for connecting the external load across the battery and repetitively controlling the power transistor(s) to conduct so that a large transient current is drawn from the battery by the load for a plurality of short periods;
  (5) while said power transistor(s) are conducting, sampling the load voltage Vi1 between two terminals of the battery, and sampling the load voltage Vi2 between two terminals of the external load, and calculating and storing average values of Vo1 and Vi2;
  (6) determining the large transient current drawn by the load I by subtracting Vo2 from Vi2 and dividing by R;
  (7) calculating the internal resistance r of the battery by subtracting Vo1 from Vi1 and dividing by the transient large current I;
  (8) comparing the internal resistance of the battery r to be measured with the selected nominal value thereof to determine the condition of the battery.

12. The method of claim 11, wherein the power transistor is controlled to conduct for periods less than 0.01 second.

13. An apparatus for monitoring the condition of a battery by determining its internal resistance and comparing the value thereof with a predetermined value therefor selected in accordance with the type of the battery, comprising:
  a controller for controlling the apparatus so as to sample the voltage across the battery responsive to imposition of a known external load chosen responsive to the type of the battery, calculate an internal resistance of the battery to be measured, and, compare the internal resistance of the battery to be measured with a predetermined value therefor;
  an external load having a predetermined resistance;
  a voltage-sampling circuit for sampling voltage across the terminals of the battery;
  a transient current control circuit including a power transistor connected across the battery so as to be controlled by the controller to connect the load across the battery so that a large transient current is drawn by the external load from the battery; and
  a display responsive to the controller for displaying a warning responsive to comparison of the calculated value of the internal resistance of the battery to the predetermined value thereof.

14. The apparatus of claim 13, wherein the external load is a resistor, and the apparatus further comprises an amplifier optionally coupled to the external load.

15. The apparatus of claim 13, wherein the transient current control circuit comprises a power transistor.

16. The apparatus of claim 15, wherein the load element is the internal resistance of the power transistor.

17. The apparatus of claim 13, wherein the load element is a conductor extending between two terminals of the battery to be measured.

18. The apparatus of claim 13, wherein the transient current control circuit comprises two or more parallel power transistors.

19. The apparatus of claim 13, wherein the resistance of the external load is in a range from 25 u$\Omega$ to 1000 m$\Omega$.

20. The apparatus of claim 13, wherein the resistance of the external load is coupled to an amplifier.

21. The apparatus of claim 13, wherein the predetermined warning value of the internal resistance of the battery to be measured is 0.001$\Omega$ to 1.5$\Omega$.

22. The apparatus of claim 13, wherein the transient large current is in a range from 1 A to 500 A.

23. The apparatus of claim 13, wherein the transient large current is in a range from 1 C to 5 C.

24. The apparatus of claim 13, wherein the voltage sampling time is less than 0.01 second.

25. The apparatus of claim 13, further comprising a voltage-stabilizing circuit for providing a stable voltage to the apparatus during operating periods.

26. A method of measuring the internal resistance of a battery, comprising the steps of:
  (1) choosing an external load, the resistance R of which is selected in accordance with the type of the battery to be evaluated;
  (2) selecting a value for the nominal internal resistance of the battery in accordance with its type;
  (3) sampling the no load voltage Vo1 between two terminals of the battery a plurality of times, and sampling the no load voltage Vo2 between two terminals of the external load a plurality of times, and calculating and storing average values of the voltages Vo1 and Vo2;
  (4) providing at least one power transistor controlled for connecting the external load across the battery and repetitively controlling the power transistor(s) to conduct so that a large transient current is drawn from the battery by the load for a plurality of short periods;
  (5) while said power transistor(s) are conducting, sampling the load voltage Vi1 between two terminals of the battery, and sampling the load voltage Vi2 between two terminals of the external load, and calculating and storing average values of Vo1 and Vi2;
  (6) determining the large transient current drawn by the load I by subtracting Vo2 from Vi2 and dividing by R; and
  (7) calculating the internal resistance r of the battery by subtracting Vo1 from Vi1 and dividing by the transient large current I.

27. The method of claim 26, wherein the power transistor is controlled to conduct for periods less than 0.01 second.

* * * * *